United States Patent
Kim et al.

(10) Patent No.: US 7,213,329 B2
(45) Date of Patent: May 8, 2007

(54) METHOD OF FORMING A SOLDER BALL ON A BOARD AND THE BOARD

(75) Inventors: Seung-Woo Kim, Asan (KR); Pyeong-Wan Kim, Cheonan (KR); Sang-Ho Ahn, Suwon (KR); Bo-Seong Kim, Seoul (KR); Ho-Jeong Mun, Cheonan (KR); Tae-Seong Park, Cheonan (KR); Hee-Guk Choi, Seoul (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 54 days.

(21) Appl. No.: 11/196,243

(22) Filed: Aug. 4, 2005

(65) Prior Publication Data

US 2006/0035453 A1 Feb. 16, 2006

(30) Foreign Application Priority Data

Aug. 14, 2004 (KR) .................. 10-2004-0064118
Jun. 15, 2005 (KR) .................. 10-2005-0051263

(51) Int. Cl.
*H05K 3/00* (2006.01)
*H05K 3/40* (2006.01)
*H05K 7/06* (2006.01)
*H01L 21/44* (2006.01)

(52) U.S. Cl. .................. 29/829; 29/842; 438/613; 361/767

(58) Field of Classification Search .......... 361/767; 29/829, 842; 438/613

See application file for complete search history.

(56) References Cited

U.S. PATENT DOCUMENTS

| | | | | | |
|---|---|---|---|---|---|
| 5,137,825 | A | * | 8/1992 | Inoue et al. | 435/245 |
| 5,477,086 | A | * | 12/1995 | Rostoker et al. | 257/737 |
| 5,706,178 | A | * | 1/1998 | Barrow | 361/777 |
| 5,736,790 | A | * | 4/1998 | Iyogi et al. | 257/780 |
| 5,872,399 | A | | 2/1999 | Lee | |
| 6,002,172 | A | * | 12/1999 | Desai et al. | 257/737 |
| 6,077,766 | A | * | 6/2000 | Sebesta et al. | 438/618 |
| 6,194,781 | B1 | * | 2/2001 | Ikegami | 257/737 |
| 6,531,384 | B1 | * | 3/2003 | Kobayashi et al. | 438/612 |
| 6,674,017 | B1 | | 1/2004 | Yamasaki et al. | |
| 6,908,311 | B2 | * | 6/2005 | Ono et al. | 439/65 |
| 6,929,978 | B2 | * | 8/2005 | Anderson | 438/108 |
| 2004/0150080 | A1 | | 8/2004 | Lee et al. | |
| 2005/0077626 | A1 | * | 4/2005 | Seiller et al. | 257/748 |
| 2005/0104188 | A1 | * | 5/2005 | Coolbaugh et al. | 257/690 |

FOREIGN PATENT DOCUMENTS

JP 2002368397 12/2002

* cited by examiner

*Primary Examiner*—Evan Pert
(74) *Attorney, Agent, or Firm*—Harness, Dickey & Pierce, PLC

(57) ABSTRACT

In the method, a conductive pad of the board is etched to a depth that is greater than 50% and less than 100% of a thickness of the conductive pad. Subsequently, a solder ball may be formed on the etched conductive pad. For example, the conductive pad may be copper.

23 Claims, 10 Drawing Sheets

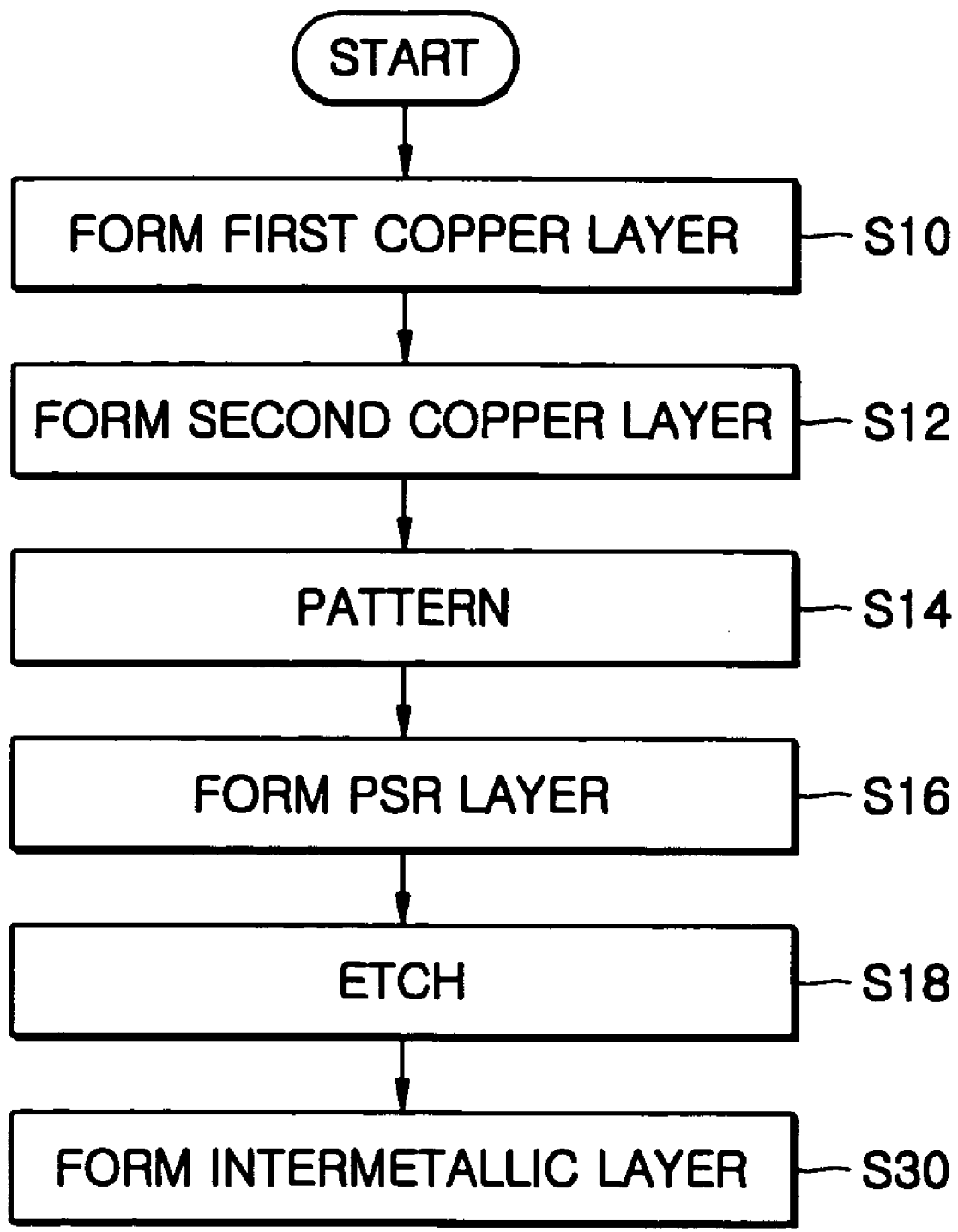

METHOD OF FORMING A SOLDER BALL ON A BOARD AND THE BOARD

FOREIGN PRIORITY INFORMATION

This application claims priority under 35 U.S.C. 119 on Korean Application No. 2004-64118 filed Aug. 14, 2004 and Korean Application No. 2005-0051263, filed Jun. 15, 2005, the entire contents of both of which are hereby incorporated by reference.

BACKGROUND OF THE INVENTION

FIG. 1 illustrates a cross-section of an example solder ball connection between a package board and a module board according to the prior art. A package board carries one or more chips (e.g., memory chip(s), logic chip(s), analog/RF chip(s), and/or etc.). A module board serves a board for connection to a mother board such as in a computer, or may serve as the main device board such as in a cellular phone.

As shown in FIG. 1, the conductive pad 8 of a package board 10 is formed on laminate 6 of the package board 10. The conductive pad 8 of the package board 10 includes a copper layer 12 having a layer of nickel 14 formed thereon. A gold layer 16 is formed over the nickel layer 14. Photo solder resist (PSR) 18 is formed adjacent to the nickel and gold layers 14 and 16 on the copper layer 12. The conductive pad 22 of the module board 20 may have the same structure as the package board 10 and may also include a gold layer 16. A solder ball 24 makes electrical contact with the conductive pad 8 of the package board 10 and the conductive pad 22 of the module board 20.

FIG. 2 illustrates another example of the solder ball connection between a package board and a module board according to the prior art. As shown in FIG. 2, the conductive pad 28 of the package board 30 includes a copper layer 32 formed on a laminate 26. A photo solder resist (PSR) 34 is formed over and exposes a portion of the copper layer 32.

The exposed portion of the copper layer 32 is subjected to the well-known organic solder-ability preservative (OSP) treatment. The resulting OSP coating (not shown) has strong adhesion to copper and strong resistance to oxidation. As such the OSP coating, usually 0.2 to 0.4 um thick, helps prevent the exposed portion of the copper layer from oxidizing. When the conductive pad 28 is to be soldered, the OSP coating is removed. The conductive pad 38 of the module board 40 may have the same structure as the package board 30. A solder ball 42 makes physical and electrical contact with the copper layer 32 of the package board 30 and the module board 40.

In the past, solder balls such as in the above-described embodiments included lead. However, in the interest of protecting the environment, a lead free alternative has been developed. For example, alloys of tin, silver and copper have been developed as lead free alternatives. Unfortunately, lead free solder has proven to be more brittle than leaded solder. Consequently, device failure due to, for example, cracking of the solder ball joints is of greater concern.

SUMMARY OF THE INVENTION

The present invention relates to a method of forming a solder ball on a board and the board.

In one embodiment, a conductive pad of the board is etched to a depth that is greater than 50% and less than 100% of a thickness of the conductive pad. Subsequently, a solder ball is formed on the etched conductive pad. For example, the conductive pad may be copper.

In one embodiment, the depth of the etching is 60% to 90% of the thickness of the conductive pad.

The solder ball may be a lead free solder ball. For example, the solder ball may include tin, silver and copper.

In one embodiment, the method further includes forming an interface layer on the conductive pad after the etching step and before the forming step. For example, the interface layer may include one of gold, silver, platinum and palladium. The interface may be a gold layer plated to a thickness less than 0.2 um.

In one embodiment, the method may further include forming a polymer layer over the board to cover the solder ball, and removing a portion of the polymer layer to expose the solder ball. In one embodiment, a width of the exposed portion of the solder ball is less than a diameter of the solder ball.

In another embodiment of the present invention, a conductive pad of the board may be formed by forming a first layer of conductive material according to a first forming process and forming a second layer of the conductive material on the first layer according to a second forming process. Then, the conductive pad of the board is etched to a thickness greater than the second layer and less than a thickness of the conductive pad.

A further embodiment of the present invention is a board having a conductive pad formed thereon. The conductive pad is recessed to a depth greater than 50% and less than 100% of a thickness of the conductive pad. A solder ball is disposed on the conductive pad and fills the recess.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein:

FIG. 6 illustrates a flow chart of a method for forming a conductive pad according to another embodiment of the present invention;

DETAILED DESCRIPTION OF EXAMPLE EMBODIMENTS

Figure 3:
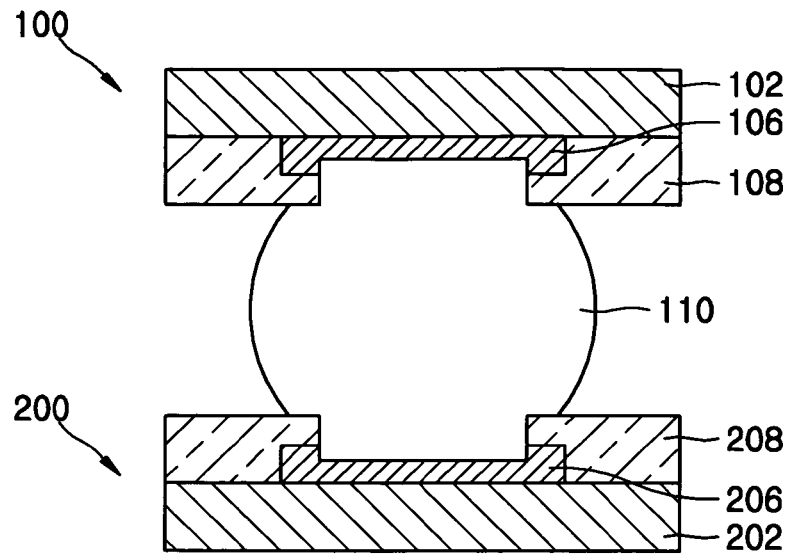
FIG. 3 illustrates a cross-section of an example solder ball connection between a package board and a module board according to an embodiment of the present invention.

FIG. 3 illustrates a cross-section of an example solder ball connection between a package board and a module board according to an embodiment of the present invention. As shown, a laminate 102 of a package board 100 has a conductive pad 106 formed thereon. When formed, the laminate 102 and conductive pad 106 are covered with a photo solder resist 108 and then etched such that a recessed portion of the conductive pad 106 becomes exposed. The depth of the recessed portion is greater than 50% a thickness of the conductive pad 106, but less than 100% of the thickness of the conductive pad 106. In one embodiment, the recessed portion is between 60% to 90% of the thickness of the conductive pad 106.

As further shown, a laminate 202 of a package board 200 has a conductive pad 206 formed thereon. When formed, the laminate 202 and conductive pad 206 are covered with a photo solder resist 208 and then etched such that a recessed portion of the conductive pad 206 becomes exposed. The depth of the recessed portion is greater than 50% a thickness of the conductive pad 206, but less than 100% of the thickness of the conductive pad 206. In one embodiment, the recessed portion is between 60% to 90% of the thickness of the conductive pad 206.

A solder ball 110 physically and electrically connects the conductive pad 106 of the etched package board 100 with the conductive pad 206 of the etched module board 200. The solder ball 110 fills the recess in both the conductive pad 106 and the conductive pad 206. This structure helps resist the cracking, particularly, at the solder/pad interface. The solder ball may therefore be a leaded or leadless solder. For example, the leadless solder may be a tin, silver and copper alloy.

Figure 4:
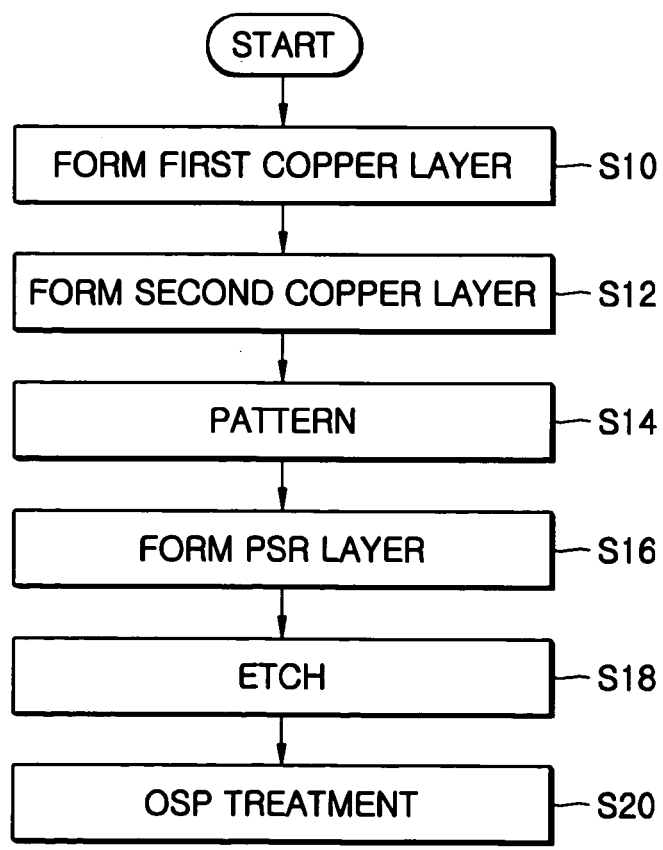
FIG. 4 illustrates a flow chart of a method for forming a conductive pad according to an embodiment of the present invention.

FIG. 4 illustrates a method of forming a conductive pad on a board (package or module) according to an embodiment of the present invention. For the purposes of explanation only, the method embodiment of FIG. 4 will be described with respect to the formation of the conductive pad 106 for the package board 100 shown in FIG. 3. As shown, in step S10 a first copper layer 106-1 is formed on the laminate 102 of the package board 100. The first copper layer 106-1 may be formed by any well-known electroless or electrolytic method to form a copper clad layer.

Then, in step S12, a second copper layer 106-2 is formed on the first copper layer 106-1. The second copper layer 106-2 may be formed by any well-known electroless or electrolytic method using the first copper layer 106-1 as a seed layer. In one embodiment, for example, the first copper layer 106-1 is formed by an electroless method and the second copper layer 106-2 is formed by an electrolytic method.

Figure 5A:
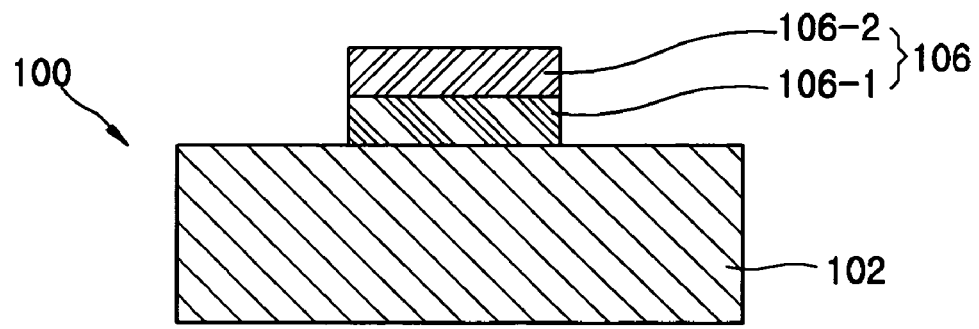
FIGS. 5A–5F illustrate cross-sections of the conductive pad being formed according to the method of FIG. 4.
Figure 5B:
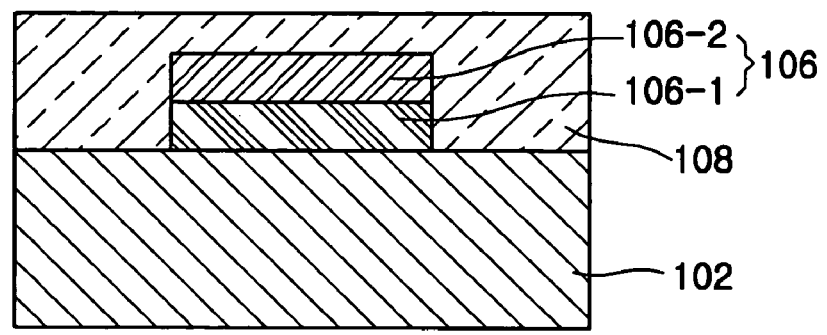

The first copper layer 106-1 and the second copper layer 106-2 are then patterned in step S14 to form the conductive pad 106. In one embodiment, the conductive pad 106 has a thickness of 20 um where the first copper layer 106-1 and the second copper layer 106-2 each have a thickness of 10 um. FIG. 5A illustrates a cross-section of the resulting structure. Next, in step S16, a photo solder resist (PSR) 108 is formed over the laminate 100 as shown in FIG. 5B. For example, the PSR 108 may be phthalocyanine. Then, the PSR 108 and the conductive pad 106 are etched to form an exposed recess in the conductive pad 106 in step S18. Alternatively, the PSR 108 may be patterned and then the conductive pad 106 etched. As a further alternative, the PSR 108 may be formed by printing, which eliminates the need for patterning the PSR 108.

Figure 5C:
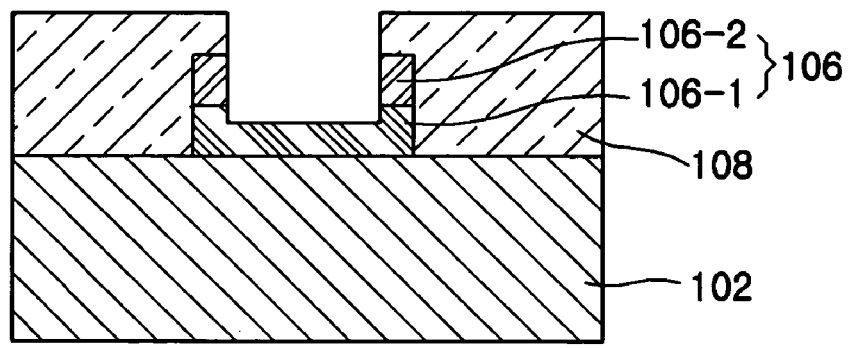
Figure 5D:
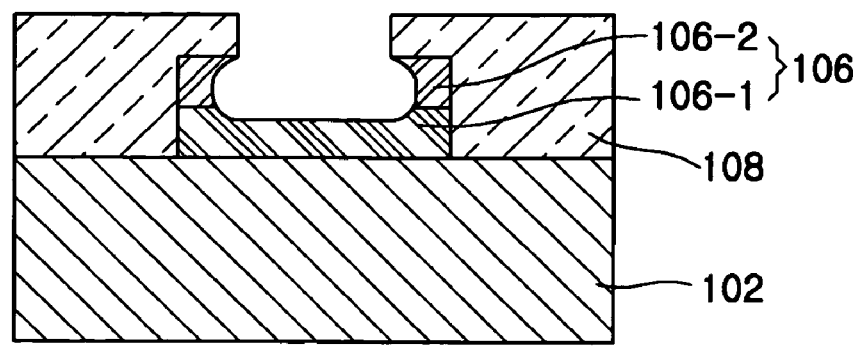

In one embodiment, the etching in step S18 is anisotropic etching such that the resulting recessed conductive pad 106 has vertical sidewalls as shown in FIG. 5C. For example, anisotropic etching may be performed by dry etching, plasma etching and reactive ion etching (RIE). In another embodiment, the etching is isotropic etching such that the resulting recessed conductive pad 106 has side walls undercut beneath an upper surface of the conductive pad 106 as shown in FIG. 5D. One example of the reaction for etching the copper conductive pad 106 is described below. The Cu etching process may be a controlled step and/or condition such as:

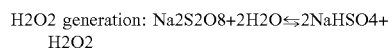
H2O2 generation: Na2S2O8+2H2O⇌2NaHSO4+ H2O2

Cu oxidation: Cu+H2O2→CuO+H2O

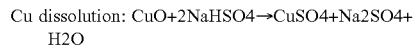
Cu dissolution: CuO+2NaHSO4→CuSO4+Na2SO4+ H2O

Total reaction: Cu+Na2S2O8→CuSO4+Na2SO4

Whether anisotropic or isotropic etching is performed, in the etching step, an entire thickness of the second copper layer 106-2 is completely removed as shown in FIGS. 5C and 5D. However, the first copper layer 106-1 may be partially etched, but not completely removed. In other words, the conductive pad 106 is etched to a depth greater than 50% and less than 100% of the thickness of the conductive pad 106. For example, in one embodiment, the recess has a depth of 12 um to 18 um when the thickness of the conductive pad is 20 um (e.g., a 10 um first copper layer 106-1 and a 10 um second copper layer 106-2). Namely, in this embodiment, the conductive pad is etched to a depth between 60% to 90% of the thickness of the conductive pad 106.

Figure 5E:
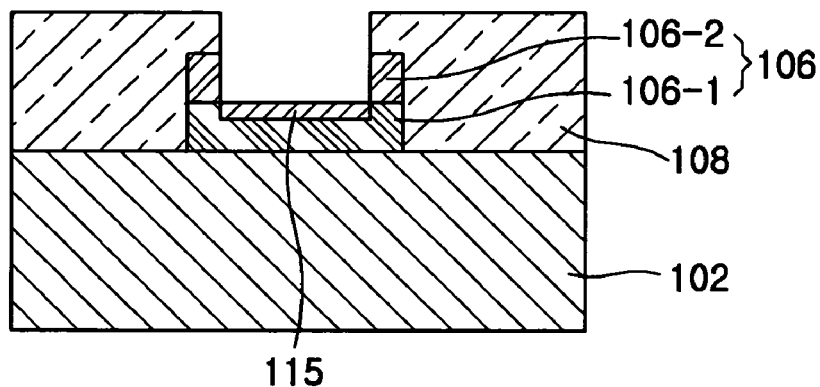
Figure 5F:
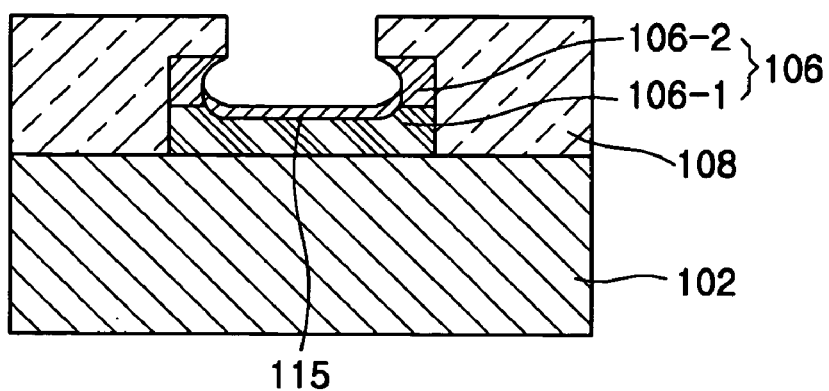

The conductive pad 106 is then coated according to any well-known OSP treatment method in step S20 to protect the exposed recess against oxidization until the board is soldered. FIGS. 5E and 5F show the resulting OSP layer 115, which has a thickness of 0.2 to 0.4 um, on the recessed conductive pad of FIGS. 5C and 5D, respectively. While shown with vertical or concave side walls, the recess may have any shape of side wall such as convex, etc.

As will be appreciated, when the conductive pad is soldered, the OSP layer is removed according to any well known process, and then soldered. For example, the method of FIG. 4 may be performed to form the conductive pads 106 and 206 shown in FIG. 3, and may then be soldered to form the structure of FIG. 3.

Figure 1:
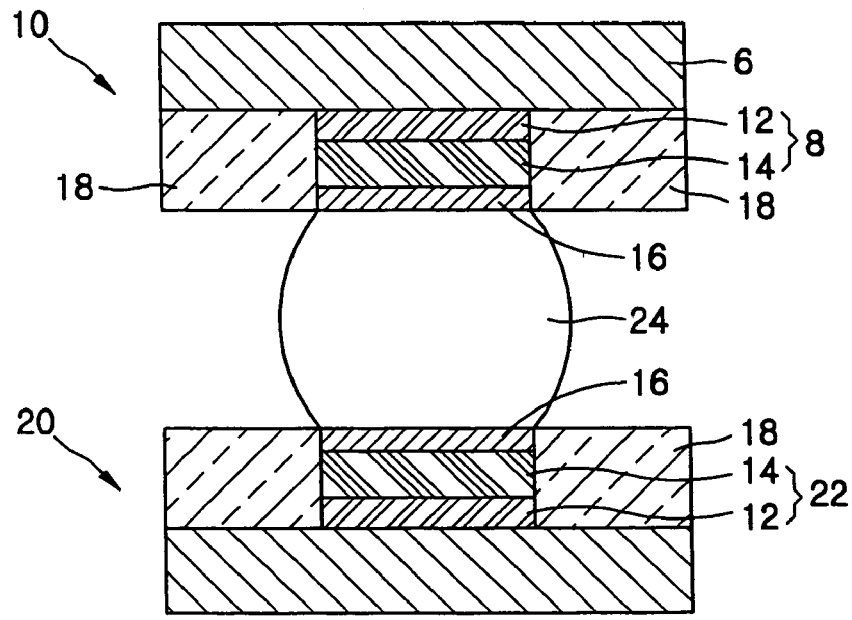
FIG. 1 illustrates a cross-section of an example solder ball connection between a package board and a module board according to the prior art.
Figure 2:
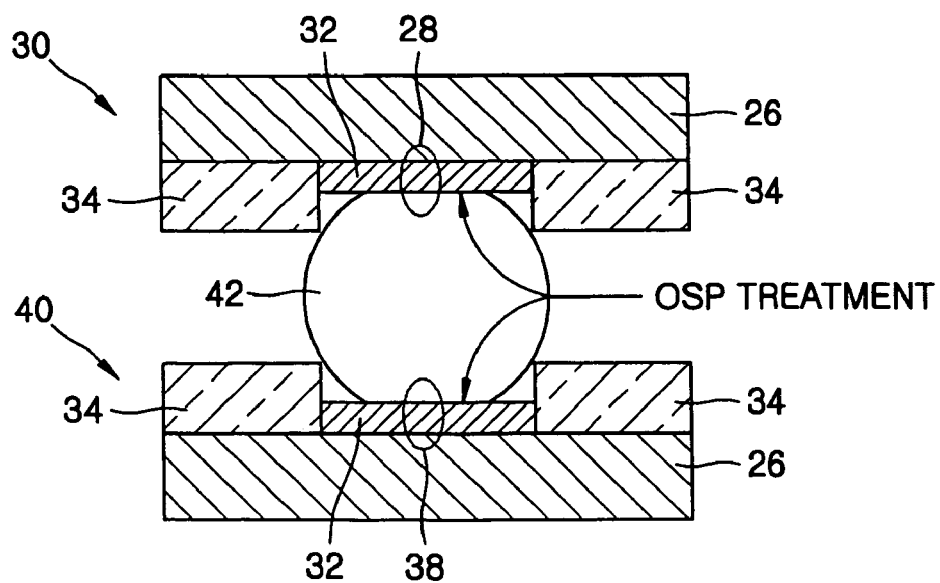
FIG. 2 illustrates another example of the solder ball connection between a package board and a module board according to the prior art.

While this embodiment of the present invention has been described with respective to a copper only conductive pad, the present invention is not limited to a copper only conductive pad. Instead, for example, a conductive pad as shown in FIG. 1 may be formed, and recessed as discussed above with respect to FIG. 4.

Figure 5G:
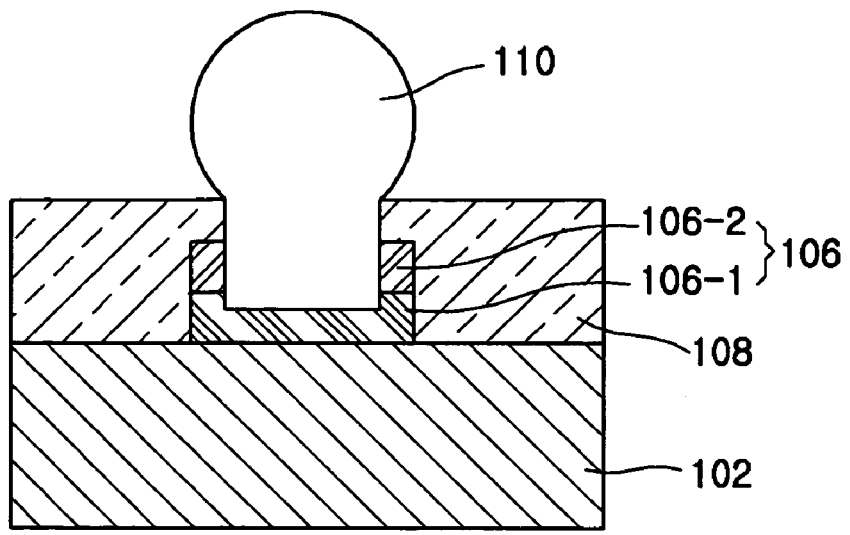
FIGS. 5G and 5H illustrate cross-sections of the board in FIGS. 5E and 5F, respectively, after having solder balls formed thereon.
Figure 5H:
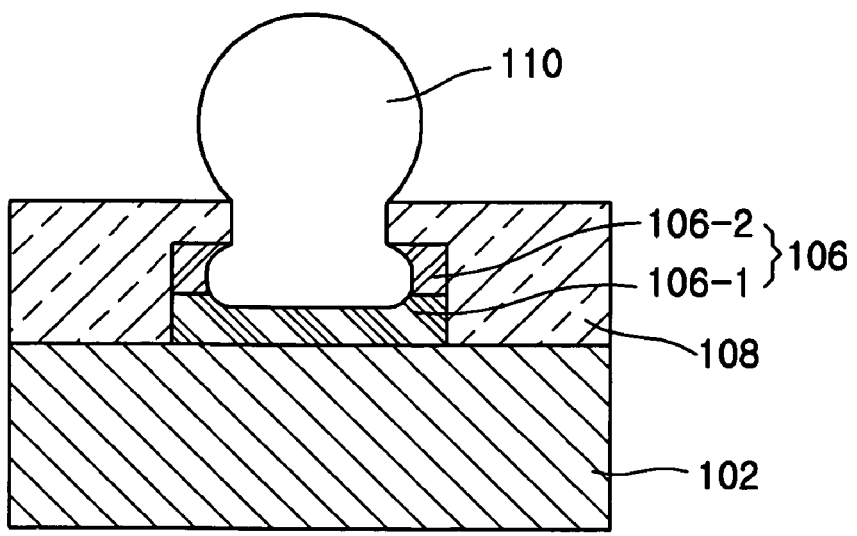

After the method of FIG. 4, the board 106 may be soldered. First, the OSP layer 115 is removed according to any well know technique, and then solder balls 110 are deposited as shown in FIGS. 5G and 5H according to any well-known method.

It will be appreciated that various cleaning, drying, etc. steps are also performed during the formation of the conductive pads and subsequent soldering. For the sake of brevity and clarity, these routine processing steps have not been described.

Figure 7A:
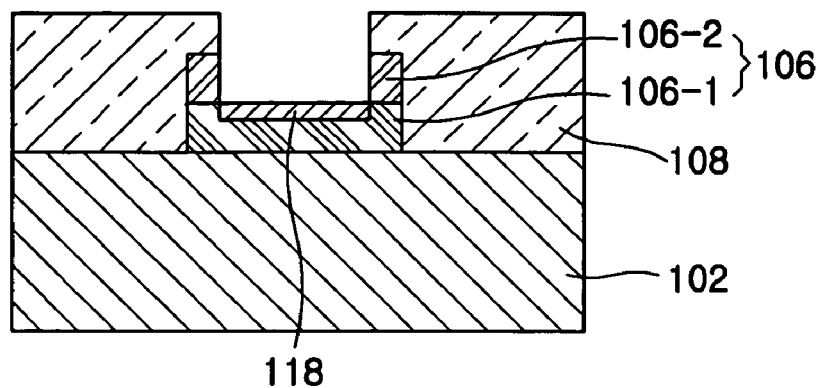
FIGS. 7A–7B illustrates cross-sections of the conductive pad being formed according to the method of FIG. 6.
Figure 7B:
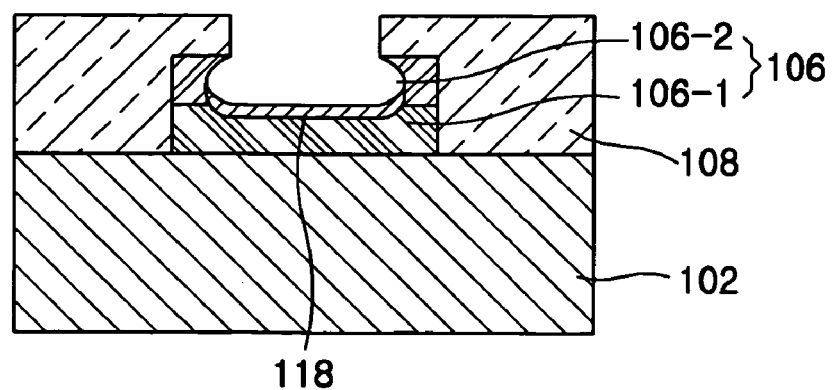

FIG. 6 illustrates a method of forming a conductive pad on a board (package or module) according to another embodiment of the present invention. The method of FIG. 6 is the same as the method of FIG. 4 for steps S10 to S18. However, after step S18, the method of FIG. 6 continues with step S30 in which an intermetallic interface layer 118 (see FIGS. 7A and 7B described below) is formed over the portion of the copper pad 106 exposed by the etching in step S18. The interface layer 118 may be one of gold, silver, platinum and palladium. For example, when the interface layer 118 is gold, the gold layer may be formed to a thickness less than 2 um by plating. The constituent element for Au plating may be Potassium Gold Cyanide (PGC), KAu(CN)2. Here, copper (Cu) is dissolved into K+, Au(CN) 2-ion solution after an AU strike process using Citric acid. As is well-known, the Au strike process enhances adhesion between Cu and Au, and may be at high current density. The Au plating may then be performed to provide better electrical characteristics and to improve bond-ability:

FIGS. 7A and 7B illustrate the resulting structure for the examples of anisotropic and isotropic etching, respectively. As will be appreciated, when the conductive pad is soldered, the gold layer is not removed. Instead the gold layer promotes interfacing with and adherence to the solder, even leadless solder.

Figure 7C:
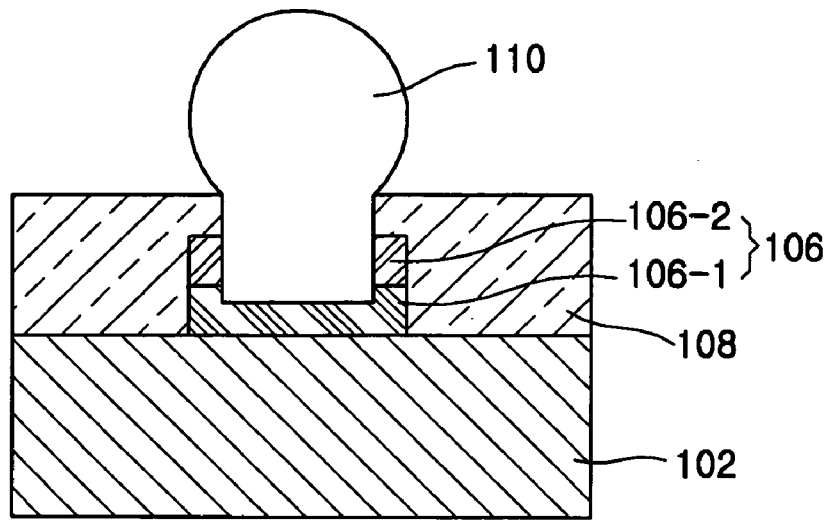
FIGS. 7C and 7D illustrate cross-sections of the board in FIGS. 7A and 7B, respectively, after having solder balls formed thereon.
Figure 7D:
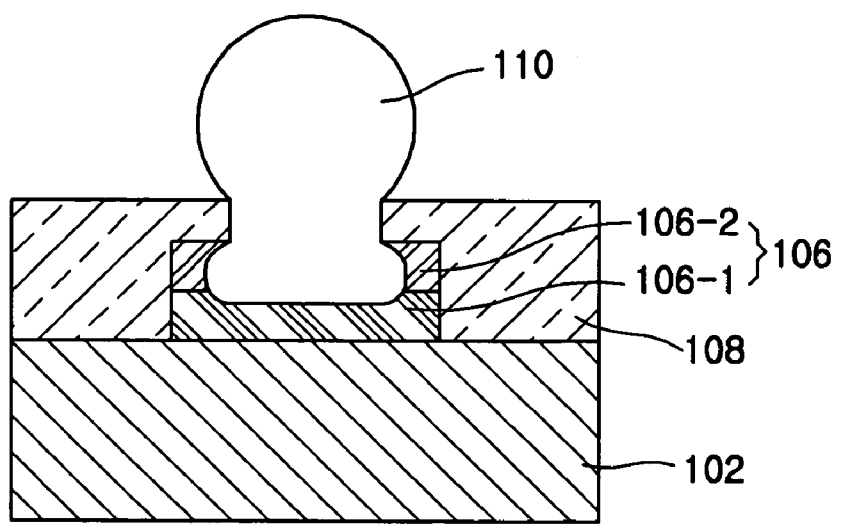

After the method of FIG. 6, the board 106 may be soldered. Namely, a solder ball 110 is deposited as shown in FIGS. 7C and 7D according to any well-known method. The intermetallic layer 118 diffuses into the solder balls 110 such that a highest concentration of the one of gold silver, platinum, and palladium atoms in the solder ball 110 is at an interface with the copper pad.

Figure 8:
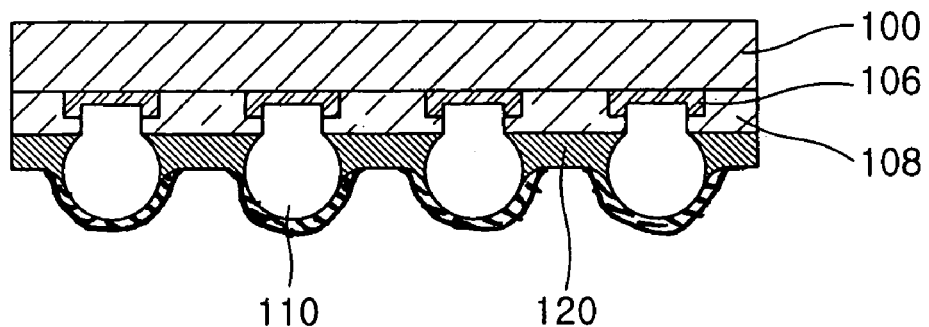
FIGS. 8 and 9 illustrate the conductive pad structures after further processing according to embodiments of the present invention.

With respect to any of the embodiments of the present invention, after forming the solder balls on the board, a polymer layer 120 is formed over the board to cover the solder ball or solder balls 110 as shown in FIG. 8. The polymer layer 120 may be formed by one of screen printing, spin coating, dipping the board into a liquid material, and dispensing a liquid material over the board. The polymer layer may be a photosensitive polymer layer such as one of polymide and polybenzoxazole.

Figure 9:
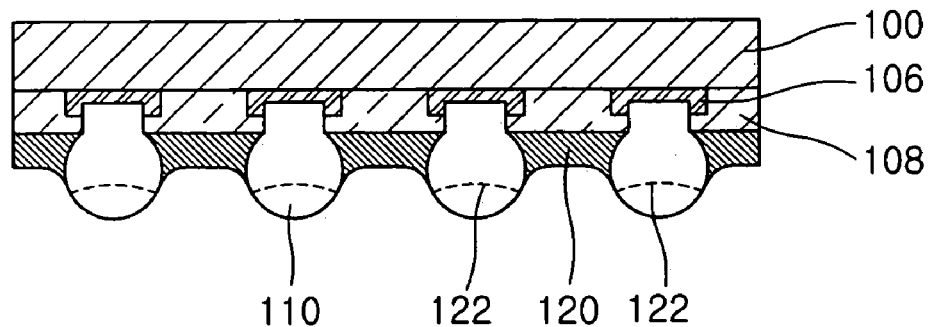

Next, a portion of the polymer layer 120 is removed to expose the solder ball 110 as shown in FIG. 9. In one embodiment, as shown in FIG. 9, a width of the exposed portion of the solder ball 110, as indicated by line 122, is less than a diameter of the solder ball 110. This polymer layer 120 helps maintain the solder balls 110 in place and promotes crack resistance.

The invention being thus described, it will be obvious that the same may be varied in many ways. Such variations are not to be regarded as a departure from the invention, and all such modifications are intended to be included within the scope of the invention.

We claim:

1. A method of forming a solder ball on a board, comprising:
   etching a conductive pad of the board, a depth of the etching being greater than 60% and less than 90% of a thickness of the conductive pad;
   forming a solder ball on the etched conductive pad;
   forming a photo solder resist layer over the board such that at least a portion of the conductive pad is exposed; and wherein
   the etching step etches part of the conductive pad disposed under the photo solder resist layer.

2. The method of claim 1, wherein the solder ball is a lead free solder ball.

3. The method of claim 2, wherein the solder ball include tin, silver and copper.

4. The method of claim 1, further comprising:
   forming an interface layer on the conductive pad after the etching step and before the forming step, the interface layer including one of gold, silver, platinum and palladium.

5. The method of claim 4, wherein the conductive pad is made of copper.

6. The method of claim 5, wherein the forming an interface layer step plates a gold layer to thickness less than 0.2 um directly on the copper conductive pad.

7. The method of claim 1, further comprising:
   forming a polymer layer over the board to cover the solder ball; and
   removing a portion of the polymer layer to expose the solder ball.

8. The method of claim 7, wherein a width of the exposed portion of the solder ball is less than a diameter of the solder ball.

9. The method of claim 7, wherein the forming a polymer layer step forms the polymer layer by one of screen printing, spin coating, dipping the board into a liquid material, and dispensing a liquid material over the board.

10. The method of claim 7, wherein the polymer layer is a photosensitive polymer layer.

11. The method of claim 10, wherein the photosensitive polymer layer is one of polymide and polybenzoxazole.

12. The method of claim 1, wherein the etching step anisotropically etches the conductive pad.

13. The method of claim 1, wherein the etching step isotropically etches the conductive pad.

14. The method of claim 1, wherein the board is one of a module board and a package board.

15. The method of claim 1, wherein the conductive pad includes a copper layer and a nickel layer.

16. The method of claim 1, wherein the conductive pad includes only a copper layer.

17. A method of forming a solder ball on a board, comprising:
   forming a conductive pad of the board, the forming step including forming a first layer of conductive material according to a first forming process and forming a second layer of the conductive material on the first layer according to a second forming process; and
   etching the conductive pad of the board, a depth of the etching being greater than a thickness of the second layer and less than a thickness of the conductive pad.

18. The method of claim 17, wherein the conductive material is copper.

19. The method of claim 18, wherein the second forming process is one of an electroless process and an electrolytic process.

20. The method of claim 19, wherein the first forming process is an electroless process.

21. The method of claim 20, wherein the second forming process is an electrolytic process.

22. A board, comprising:
  a conductive pad formed on a board, the conductive pad being recessed to a depth greater than 60% and less than 90% of a thickness of the conductive pad;
  a photo solder resist layer over the board such that at least a portion of the conductive pad is exposed; and
  a solder ball disposed on the conductive pad and filling the recess.

23. The board of claim 22, wherein the solder ball has one of gold, silver, platinum, and palladium atoms diffused therein with a highest concentration of the one of gold silver, platinum, and palladium atoms being at an interface with the conductive pad.

\* \* \* \* \*